(12) United States Patent
Chen et al.

(10) Patent No.: US 10,854,505 B2
(45) Date of Patent: Dec. 1, 2020

(54) REMOVING POLYMER THROUGH TREATMENT

(71) Applicant: Taiwan Semiconductor Manufacturing Company, Ltd., Hsin-Chu (TW)

(72) Inventors: Hung-Hao Chen, Hsin-Chu (TW); Che-Cheng Chang, New Taipei (TW); Wen-Tung Chen, Taipei (TW); Yu-Cheng Liu, Zhubei (TW); Horng-Huei Tseng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/405,391

(22) Filed: Jan. 13, 2017

(65) Prior Publication Data

US 2017/0278742 A1     Sep. 28, 2017

Related U.S. Application Data

(60) Provisional application No. 62/312,840, filed on Mar. 24, 2016.

(51) Int. Cl.
*H01L 21/768* (2006.01)

(52) U.S. Cl.
CPC .. *H01L 21/76804* (2013.01); *H01L 21/76811* (2013.01); *H01L 21/76813* (2013.01); *H01L 21/76814* (2013.01); *H01L 21/76816* (2013.01); *H01L 21/76831* (2013.01); *H01L 21/76832* (2013.01); *H01L 21/76834* (2013.01); *H01L 21/76877* (2013.01)

(58) Field of Classification Search
CPC .................................................... H01L 21/768
See application file for complete search history.

(56) References Cited

U.S. PATENT DOCUMENTS

| | | |
|---|---|---|
| 4,943,539 A | 7/1990 | Wilson et al. |
| 6,071,809 A | 6/2000 | Zhao |
| 6,696,222 B2 | 2/2004 | Hsue et al. |

(Continued)

FOREIGN PATENT DOCUMENTS

| | | |
|---|---|---|
| CN | 101106066 A | 1/2008 |
| CN | 102881641 A | 1/2013 |

(Continued)

*Primary Examiner* — Mohammad M Choudhry
(74) *Attorney, Agent, or Firm* — Slater Matsil, LLP

(57) ABSTRACT

A method includes depositing a mask layer over a dielectric layer, patterning the mask layer to form a trench, applying a patterned photo resist having a portion over the mask layer, and etching the dielectric layer using the patterned photo resist as an etching mask to form a via opening, which is in a top portion of the dielectric layer. The method further includes removing the patterned photo resist, and etching the dielectric layer to form a trench and a via opening underlying and connected to the trench. The dielectric layer is etched using the mask layer as an additional etching mask. A polymer formed in at least one of the trench and the via opening is removed using nitrogen and argon as a process gas. The trench and the via opening are filled to form a metal line and a via, respectively.

20 Claims, 18 Drawing Sheets

(56) References Cited

U.S. PATENT DOCUMENTS

| | | | | |
|---|---|---|---|---|
| 8,633,108 B1* | 1/2014 | Lee | .................... | H01L 21/76807 |
| | | | | 257/E23.063 |
| 2002/0102856 A1* | 8/2002 | Xia | .................... | H01L 21/31116 |
| | | | | 438/710 |
| 2004/0147100 A1 | 7/2004 | Jang et al. | | |
| 2006/0003577 A1* | 1/2006 | Sone | ................. | H01L 21/76802 |
| | | | | 438/638 |
| 2006/0068592 A1* | 3/2006 | Dostalik | ........... | H01L 21/02063 |
| | | | | 438/706 |
| 2008/0280436 A1* | 11/2008 | Wang | ................ | H01L 21/02063 |
| | | | | 438/675 |
| 2011/0223759 A1* | 9/2011 | Wang | ................ | H01L 21/02126 |
| | | | | 438/618 |
| 2014/0252624 A1* | 9/2014 | Huang | .............. | H01L 21/76885 |
| | | | | 257/751 |
| 2015/0048488 A1* | 2/2015 | Peng | ................. | H01L 23/53295 |
| | | | | 257/637 |
| 2015/0140827 A1* | 5/2015 | Kao | .................. | H01L 21/31116 |
| | | | | 438/704 |

FOREIGN PATENT DOCUMENTS

| | | |
|---|---|---|
| CN | 103531528 A | 1/2014 |
| CN | 104377106 A | 2/2015 |

\* cited by examiner

US 10,854,505 B2

REMOVING POLYMER THROUGH TREATMENT

PRIORITY CLAIM AND CROSS-REFERENCE

This application claims the benefit of the following provisionally filed U.S. Patent application: Application Ser. No. 62/312,840, filed Mar. 24, 2016, and entitled "FinFET Reliability Improvement by Dry Etcher Treatment;" which application is hereby incorporated herein by reference.

BACKGROUND

High-density integrated circuits, such as Very Large Scale Integration (VLSI) circuits, are typically formed with multiple metal interconnects to serve as three-dimensional wiring line structures. The purpose of the multiple interconnects is to properly link densely packed devices together. With increasing levels of integration, a parasitic capacitance effect between the metal interconnects, which leads to RC delay and cross talk, increases correspondingly. In order to reduce the parasitic capacitance and increase the conduction speed between the metal interconnections, low-k dielectric materials are commonly employed to form Inter-Layer Dielectric (ILD) layers and Inter-Metal Dielectric (IMD) layers.

One of the commonly used schemes for forming low-k related structures is Metal Hard Mask (MHM) scheme, wherein a metallic hard mask is formed to protect a low-k dielectric layer from Chemical Mechanical Polish (CMP). Typically, a cap layer or a bottom anti-reflective coating is formed on the low-k dielectric layer, followed by the formation of a metal hard mask layer. The metal hard mask layer and the cap layer are then patterned, preferably using photo resists as masks. The patterns are transferred to the underlying low-k dielectric layer to form interconnections, and the process typically includes forming openings in the low-k dielectric layer, filling the openings with a conductive material, and performing a CMP to planarize the conductive material with the metal hard mask layer. The metal hard mask layer is then removed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
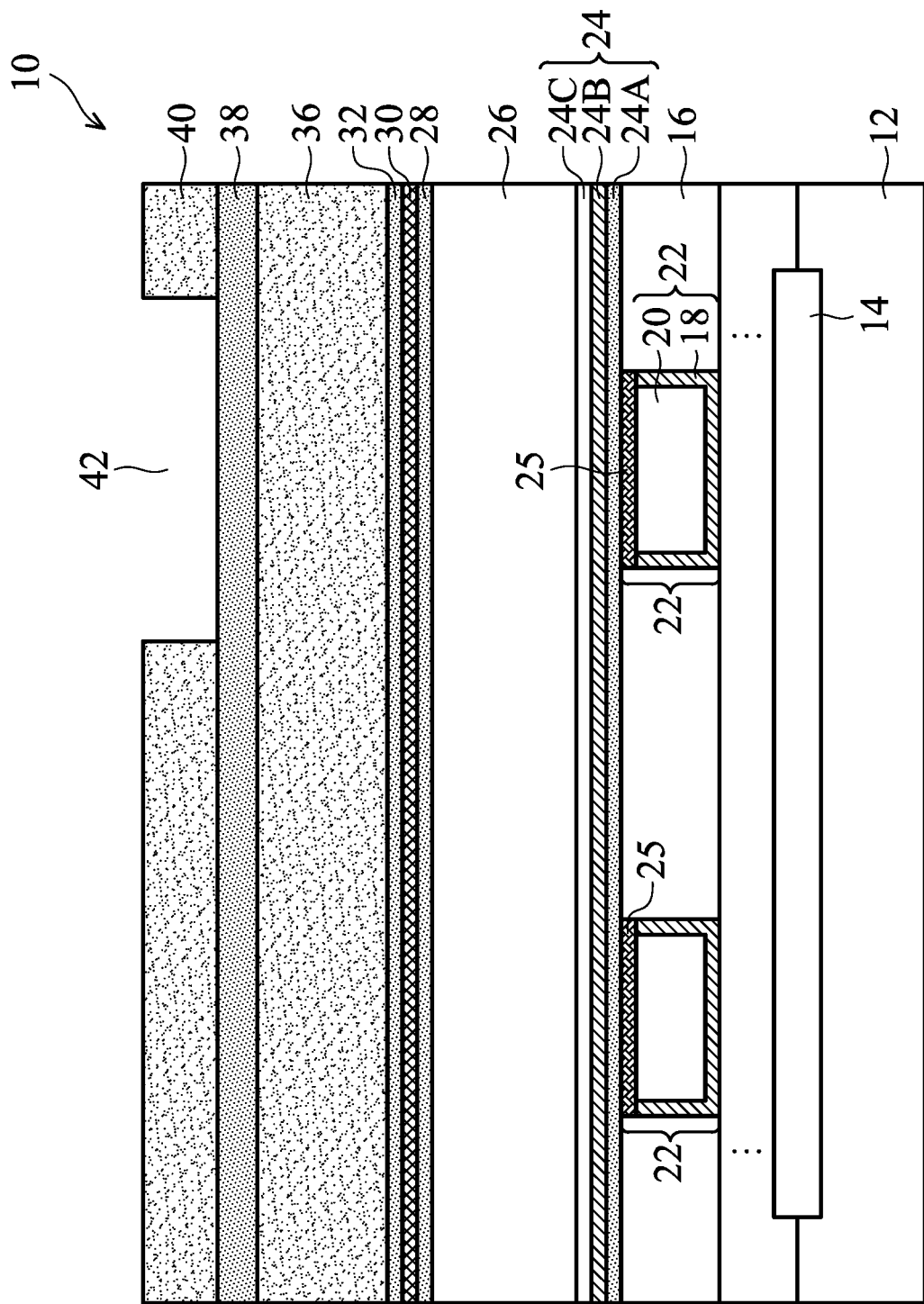
FIGS. 1 through 16 illustrate the cross-sectional views of intermediate stages in the formation of metal lines and the underlying vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Multiple patterning method for forming metal lines and vias in the interconnect structure of integrated circuits is provided in accordance with various exemplary embodiments. The intermediate stages of forming the vias are illustrated. Some variations of some embodiments are discussed. Throughout the various views and illustrative embodiments, like reference numbers are used to designate like elements.

Figure 18:
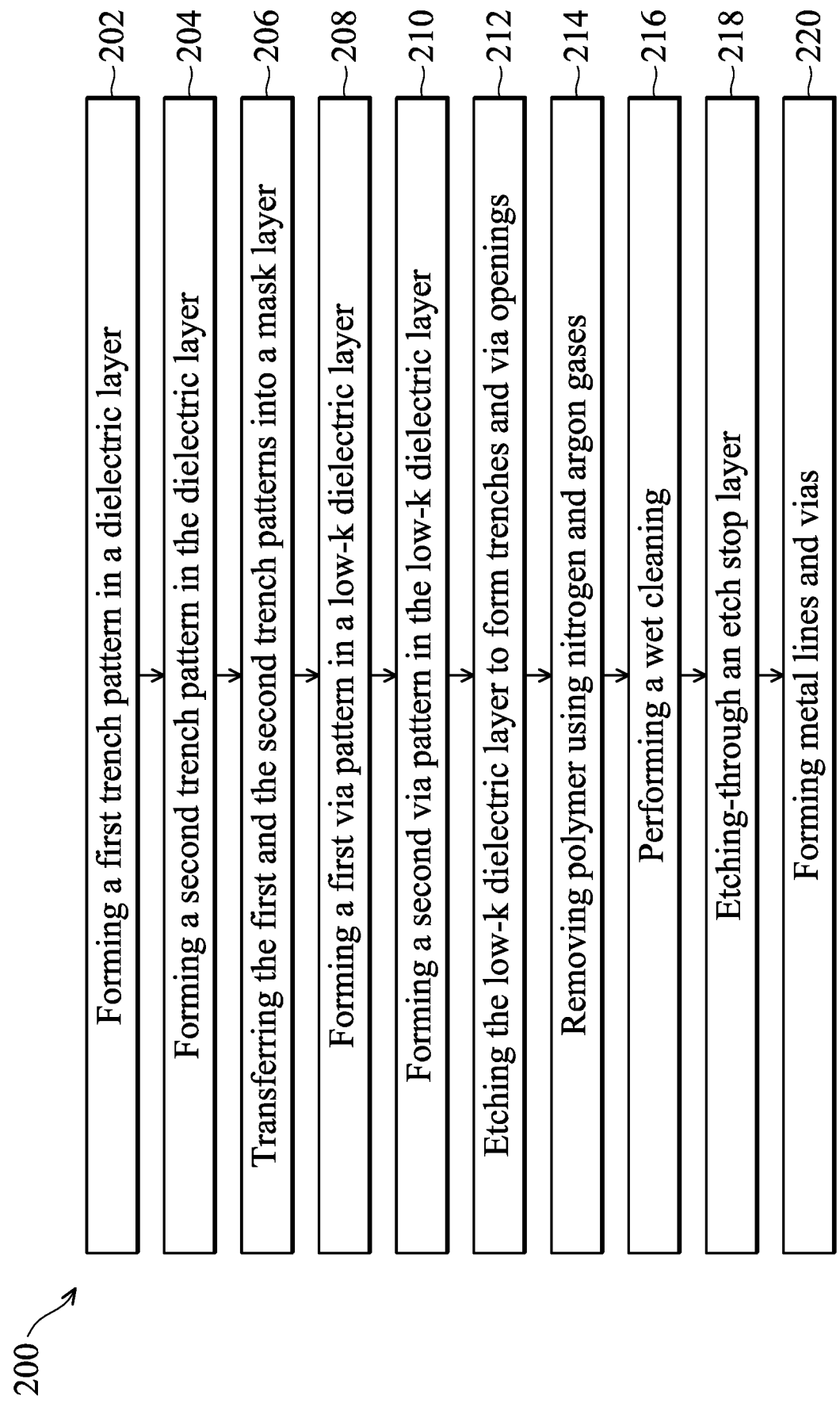
FIG. 18 illustrates a process flow for forming an integrated circuit structure including vias underlying and connected to respective overlying metal lines in accordance with some embodiments.

FIGS. 1 through 16 illustrate the cross-sectional views of intermediate stages in the formation of metal lines and vias in accordance with some embodiments. The steps shown in FIGS. 1 through 16 are also illustrated schematically in the process flow 200 shown in FIG. 18.

FIG. 1 illustrates a cross-sectional view of wafer 10, wherein the illustrated portion is a part of a device die in wafer 10. In accordance with some embodiments of the present disclosure, wafer 10 is a device wafer including active devices such as transistors and/or diodes, and possibly passive devices such as capacitors, inductors, resistors, and/or the like.

In accordance with some embodiments of the present disclosure, wafer 10 includes semiconductor substrate 12 and the features formed at a top surface of semiconductor substrate 12. Semiconductor substrate 12 may be formed of crystalline silicon, crystalline germanium, silicon germanium, and/or a III-V compound semiconductor such as GaAsP, AlInAs, AlGaAs, GaInAs, GaInP, GaInAsP, or the like. Semiconductor substrate 12 may also be a bulk silicon substrate or a Silicon-On-Insulator (SOI) substrate. Shallow Trench Isolation (STI) regions (not shown) may be formed in semiconductor substrate 12 to isolate the active regions in semiconductor substrate 12. Although not shown, through-vias may be formed to extend into semiconductor substrate 12, wherein the through-vias are used to electrically intercouple the features on opposite sides of semiconductor substrate 12. Active devices 14, which may include transistors, are formed at the top surface of semiconductor substrate 12.

Further illustrated in FIG. 1 is dielectric layer 16, which is alternatively referred to as Inter-Metal Dielectric (IMD) layer 16 hereinafter. In accordance with some embodiments of the present disclosure, IMD layer 16 is formed of a low-k dielectric material having a dielectric constant (k-value) lower than about 3.0, lower than about 2.5, or even lower. IMD layer 16 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with some embodiments of the present disclosure, the formation of IMD layer 16 includes depositing a porogen-containing dielectric material and then performing a curing process to drive out the porogen, and hence the remaining IMD layer 16 is porous.

Conductive features 22 are formed in IMD 16. In accordance with some embodiments, conductive features 22 are metal lines, each including a diffusion barrier layer 18 and a copper-containing material 20 over the respective diffusion barrier layer 18. Diffusion barrier layers 18 may be formed of titanium, titanium nitride, tantalum, tantalum nitride, or the like, and have the function of preventing copper in copper-containing material 20 from diffusing into IMD 16. Conductive lines 22 are also referred to as metal lines 22 hereinafter. Conductive features 22 may have a single damascene structure, a dual damascene structure, or may be contact plugs. In accordance with some embodiments of the present disclosure, metal caps 25 are formed as the top portions of the respective metal lines 22. Metal caps 25 may be formed of cobalt (Co), CoWP, CoB, tungsten (W), tantalum (Ta), nickel (Ni), molybdenum (Mo), titanium (Ti), iron (Fe), combinations thereof, and/or alloys thereof.

Dielectric layer 24 is formed over dielectric layer 16 and conductive lines 22. Dielectric layer 24 may be used as an Etch Stop Layer (ESL), and hence is referred to as etch stop layer or ESL 24 throughout the description. Etch stop layer 24 may include a nitride, a silicon-carbon based material, a carbon-doped oxide, Carbon-Doped Oxide (CDO), silicon Oxy-Carbide (SiOC), Oxygen-doped Silicon Carbide (ODC), or a Nitrogen-Doped silicon Carbide (NDC). Etch stop layer 24 may be a single layer formed of a homogeneous material, or a composite layer including a plurality of dielectric sub-layers. In accordance with some embodiments of the present disclosure, etch stop layer 24 includes aluminum nitride (AlN) layer 24A, ODC layer 24B over layer 24A, and aluminum oxide ($AlO_x$) layer 24C over layer 24B.

Dielectric layer 26 is formed over ESL 24. In accordance with some exemplary embodiments of the present disclosure, dielectric layer 26 is formed of a low-k dielectric material, and is referred to as low-k dielectric layer 26 hereinafter. Low-k dielectric layer 26 may be formed using a material selected from the same group of candidate materials for forming dielectric layer 16. When selected from the same group of candidate materials, the materials of dielectric layers 16 and 26 may be the same or different from each other.

In accordance with some embodiments of the present disclosure, Anti-Reflective coating Layer (ARL) 28, mask layer 30, and ARL 32 are formed over low-k dielectric layer 26. ARL 28 may be a Nitrogen-Free ARL (NFARL), which may be formed of an oxide (free from nitrogen) in accordance with some exemplary embodiments. For example, NFARL 28 may be a silicon oxide layer formed using Plasma Enhanced Chemical Vapor Deposition (PECVD).

Mask layer 30 is formed over ARL 28. Mask layer 30 is also referred to as hard mask layer 30 hereinafter. In accordance with some embodiments, hard mask layer 30 includes a metal(s), which may be in the form of a metal nitride, for example, titanium nitride. Hard mask layer 30 may also be formed of a non-metal nitride such as silicon nitride, an oxynitride such as silicon oxynitride, or the like. ARL 32 may be further formed over hard mask layer 30. ARL 32 may also be an NFARL, which may be formed of an oxide, such as silicon oxide, and may be formed using PECVD.

FIGS. 1 through 7 illustrate the cross-sectional views of intermediate stages in the patterning of ARL 32 and mask layer 30 in accordance with some embodiments of the present disclosure. The patterning of ARL 32 and mask layer 30 may be achieved through a two-patterning-two-etching (2P2E) process, wherein two neighboring trenches are formed using different lithography processes, so that neighboring trenches may be located close to each other without incurring optical proximity effect.

FIGS. 1 through 4 illustrate the intermediate stages in a first-photo-first-etching process for forming a first trench. The respective step is illustrated as step 202 in the process flow shown in FIG. 18. In accordance with some embodiments of the present disclosure, a tri-layer is formed over layer 32, which tri-layer includes bottom layer (also sometimes referred to as under layer) 36, middle layer 38 over bottom layer 36, and upper layer 40 over middle layer 38. In accordance with some embodiments, bottom layer 36 and upper layer 40 are formed of photo resists. Middle layer 38 may be formed of an inorganic material, which may be a nitride (such as silicon nitride), an oxynitride (such as silicon oxynitride), an oxide (such as silicon oxide), or the like. Middle layer 38 has a high etching selectivity with relative to upper layer 40 and bottom layer 36, and hence upper layer 40 may be used as an etching mask for patterning middle layer 38, and middle layer 38 may be used as an etching mask for patterning bottom layer 36. Upper layer 40 is patterned to form opening 42, which has the pattern of a metal line that is to be formed in low-k dielectric layer 26.

Figure 2:
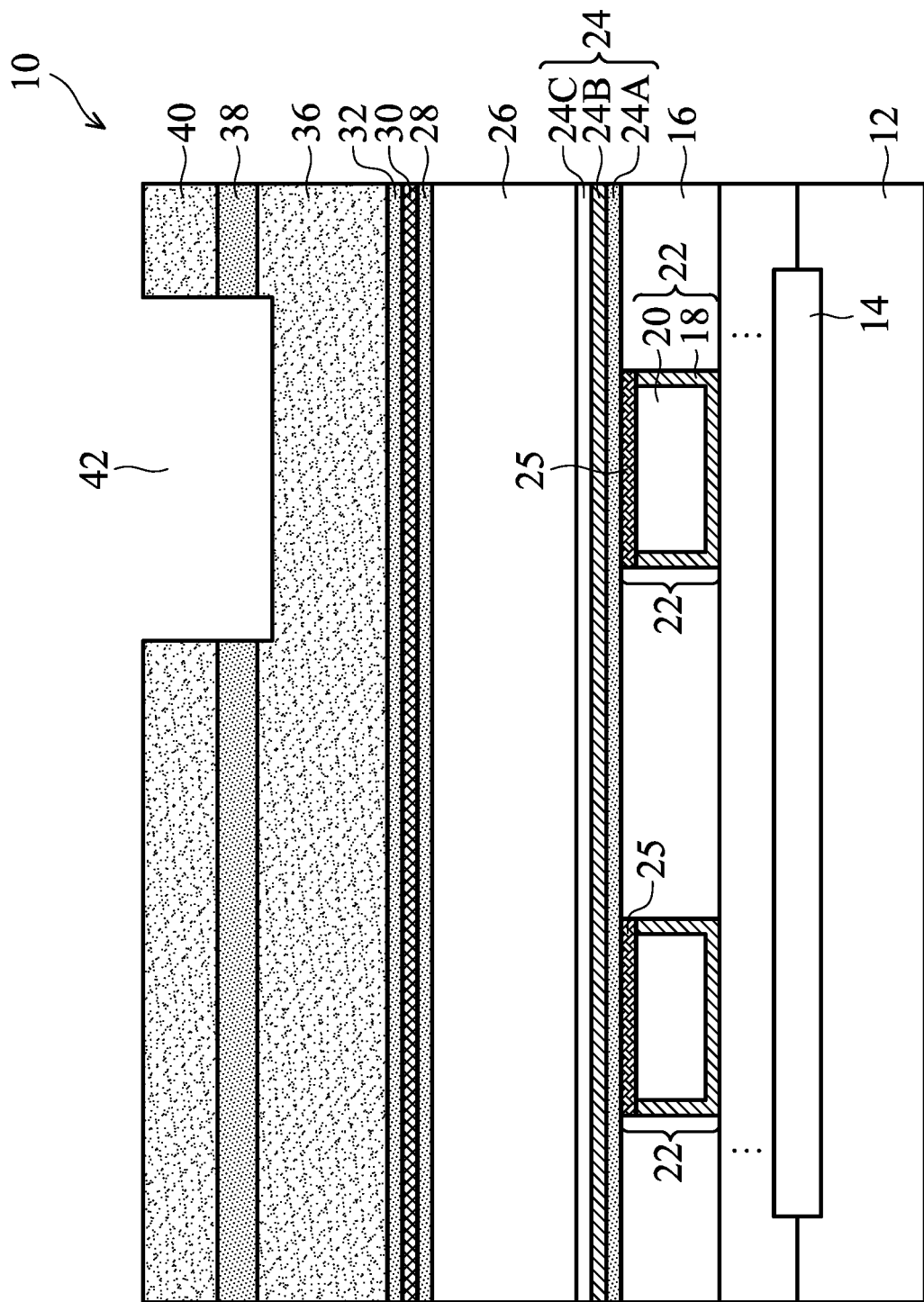
Figure 3:
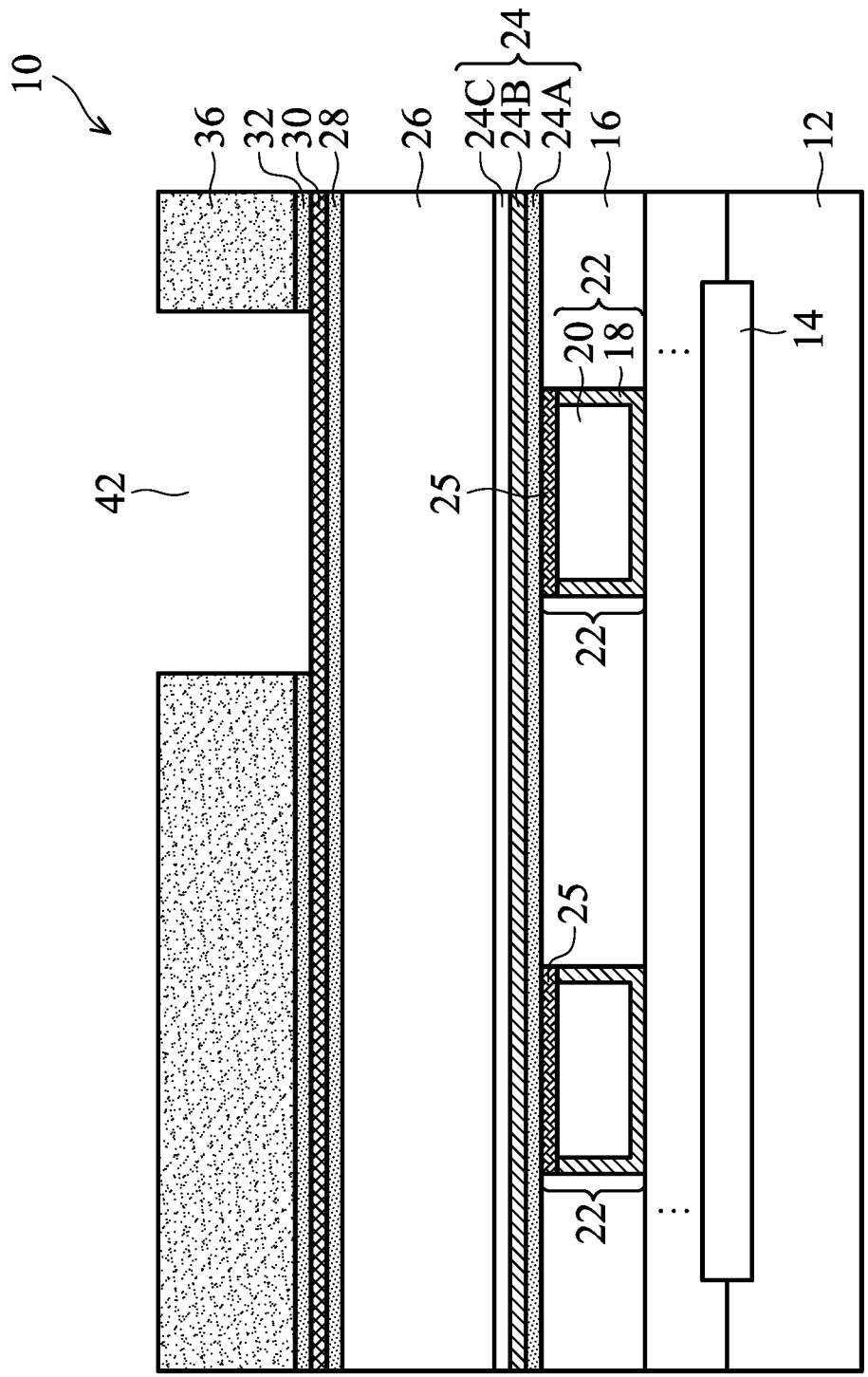

Next, referring to FIG. 2, middle layer 38 is etched using the patterned upper layer 40 as an etching mask, so that the pattern of upper layer 40 is transferred to middle layer 38. After middle layer 38 is etched-through, bottom layer 36 is patterned, wherein middle layer 38 is used as an etching mask. During the patterning of bottom layer 36, upper layer 40 is consumed. Middle layer 38 is consumed or removed if it has not been fully consumed. The resulting structure is shown in FIG. 3.

Bottom layer 36 is then used as an etching mask to etch the underlying layer 32, which etching process is referred to as the first etching process. Opening 42 thus extends into layer 32, with the top surface of layer 30 exposed to opening 42. During the patterning of layer 32, bottom layer 36 is also consumed, although at a lower etching rate than middle layer 38 (FIG. 2) and layer 32. Hence, at the time the patterning of layer 32 is finished, the thickness of bottom layer 36 is reduced.

Figure 4:
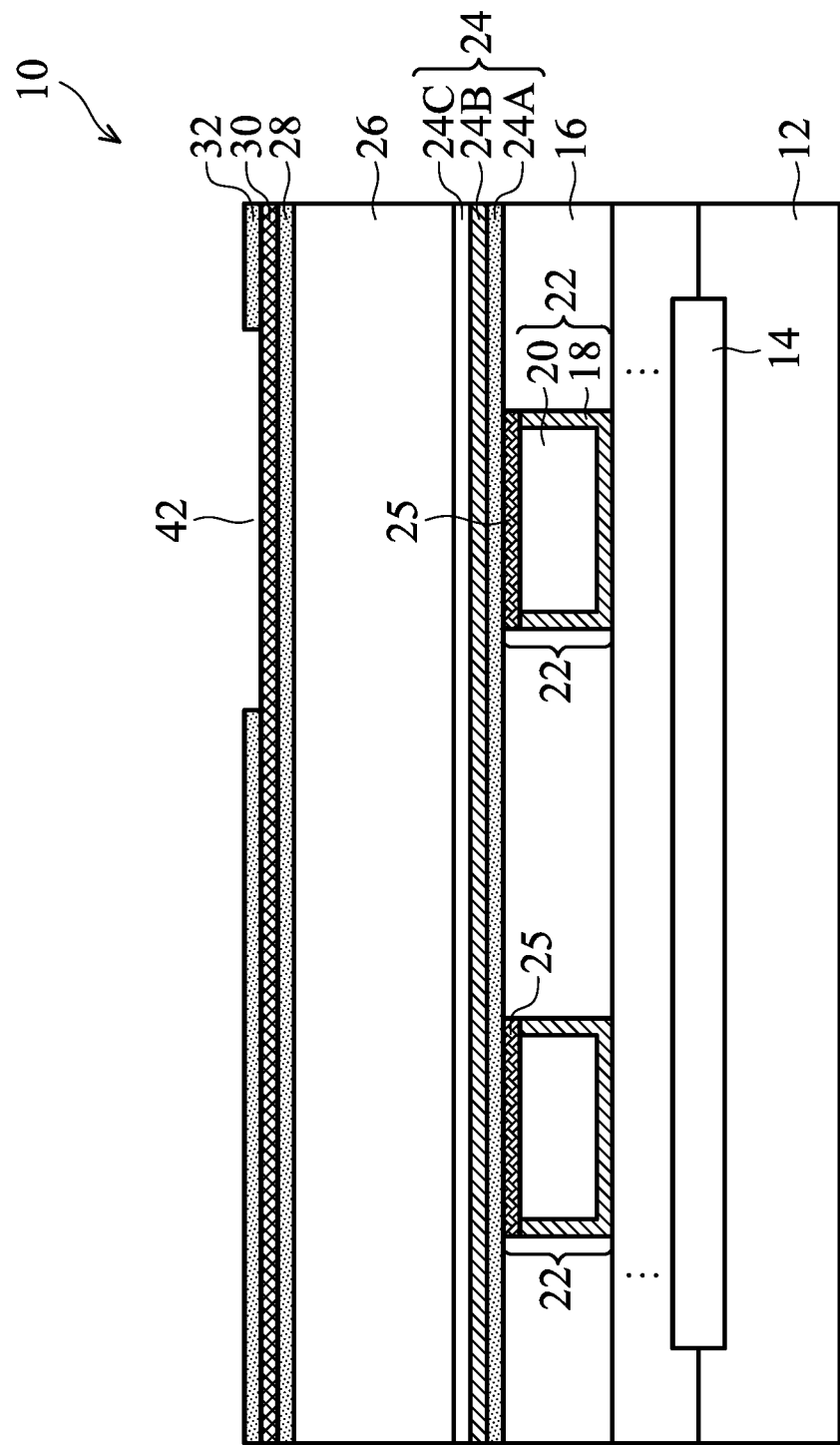

After the etching, the remaining bottom layer 36, which comprises photo resist, is removed in an ashing process, wherein oxygen is used to remove bottom layer 36 in accordance with some exemplary embodiments. The resulting structure is shown in FIG. 4.

Figure 5:
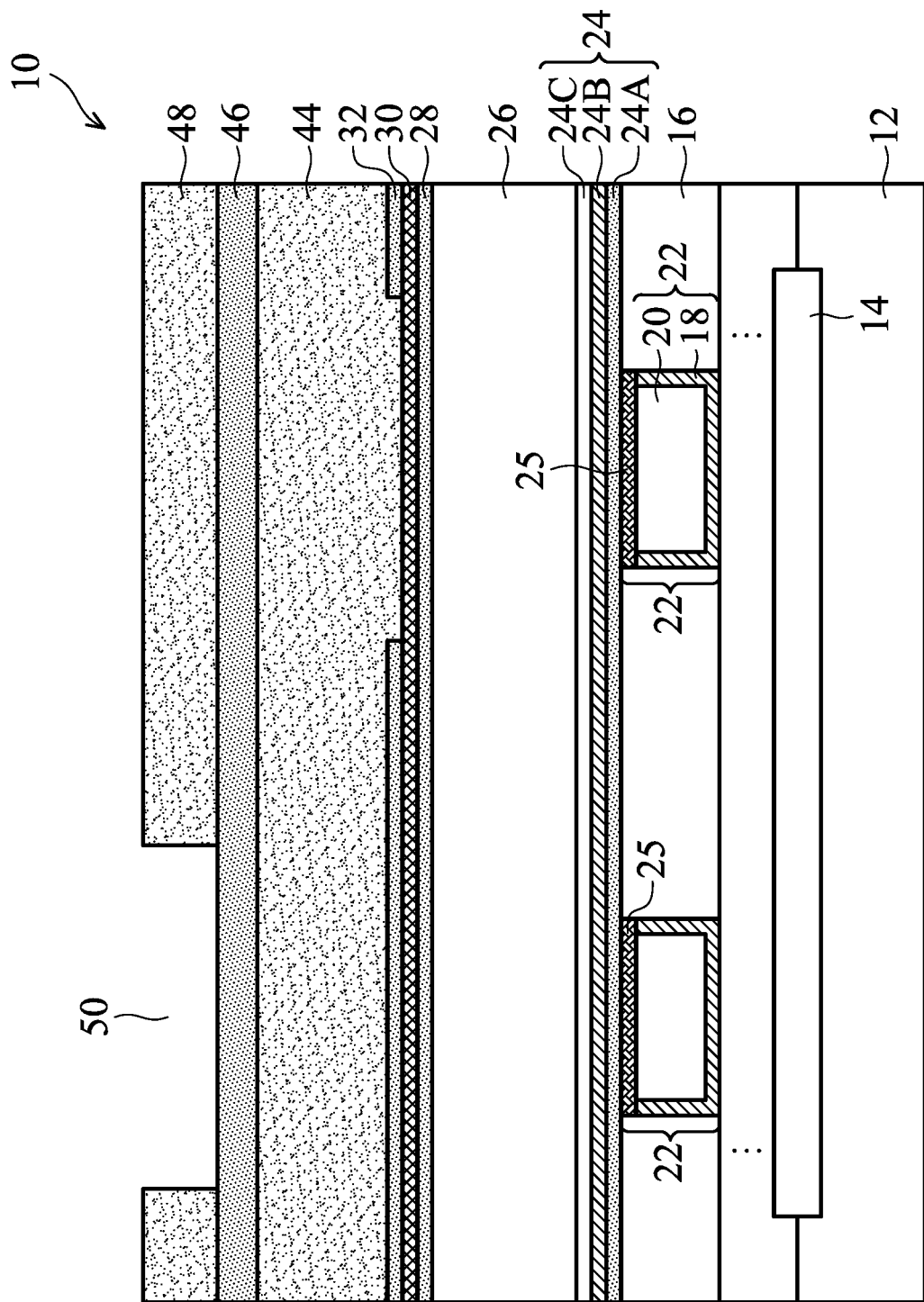
Figure 6:
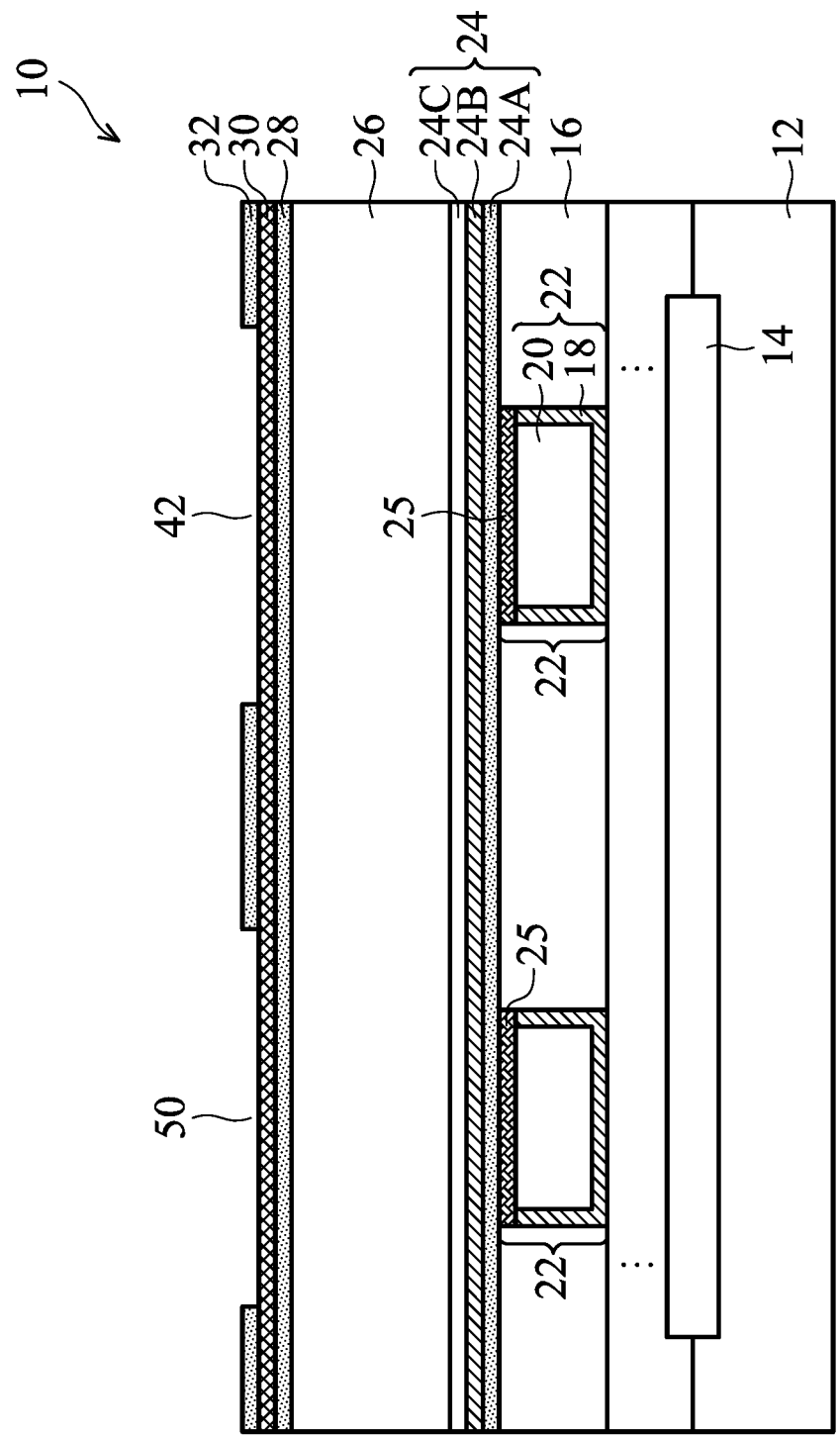
Figure 7:
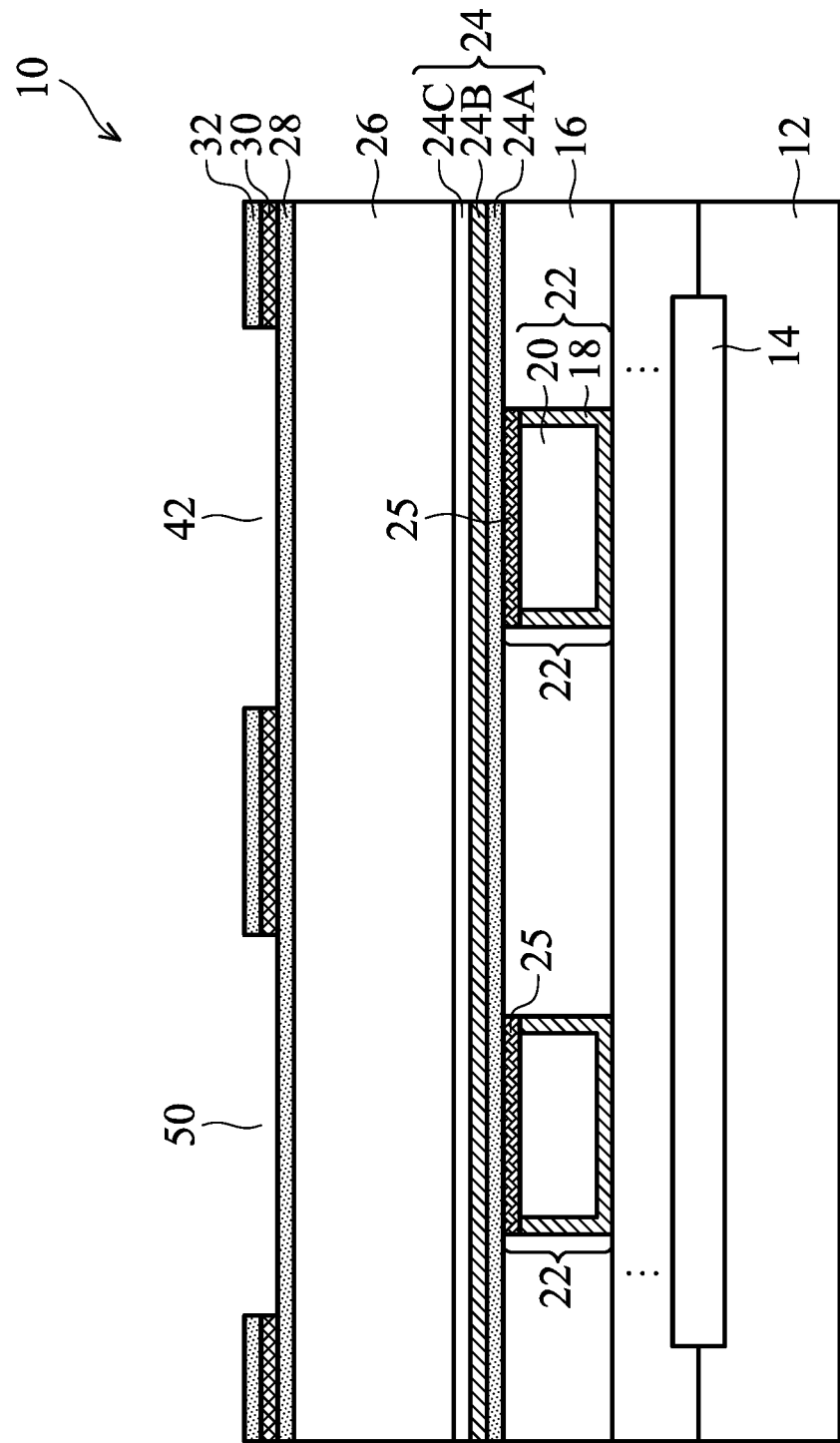

FIGS. 5 through 7 illustrate a second-photo-second-etching process in the patterning of layer 32 to form a second trench. The respective step is illustrated as step 204 in the process flow shown in FIG. 18. In accordance with some embodiments of the present disclosure, a second tri-layer is formed over layer 32, as shown in FIG. 5. The second tri-layer includes bottom layer 44, middle layer 46 over bottom layer 44, and upper layer 48 over middle layer 46. Trench 50 is formed in the patterned upper layer 48. In accordance with some embodiments, bottom layer 44 and upper layer 48 are formed of photo resists. Middle layer 46 may be formed of an inorganic material, which may be a nitride (such as silicon nitride), an oxynitride (such as silicon oxynitride), an oxide (such as silicon oxide), or the like. Middle layer 46 has a high etching selectivity with relative to upper layer 48 and bottom layer 44, and hence upper layer 48 may be used as an etching mask for patterning middle layer 46, and middle layer 46 may be used as an etching mask for patterning bottom layer 44. Upper layer 48 is patterned to form opening 50, which also has the pattern of a metal line that is to be formed in low-k dielectric layer 26.

Middle layer 46 is etched using the patterned upper layer 48 as an etching mask, so that the pattern of upper layer 48 is transferred into middle layer 46, bottom layer 44, and then into layer 32. The resulting structure is shown in FIG. 6. After the pattern transfer, remaining bottom layer 44 and middle layer 46 (FIG. 5, if any) are removed. The remaining bottom layer 44, which comprises a photo resist, may be removed in an ashing process using oxygen. Layer 32 thus includes both openings 42 and 50.

In a subsequent step, as shown in FIG. 7, mask layer 30 is etched using the patterned ARL 32 as an etching mask, so that openings 42 and 50 extend into mask layer 30. The respective step is illustrated as step 206 in the process flow shown in FIG. 18. ARL 28 is exposed, and is used as an etch stop layer in the etching of mask layer 30.

Figure 8:
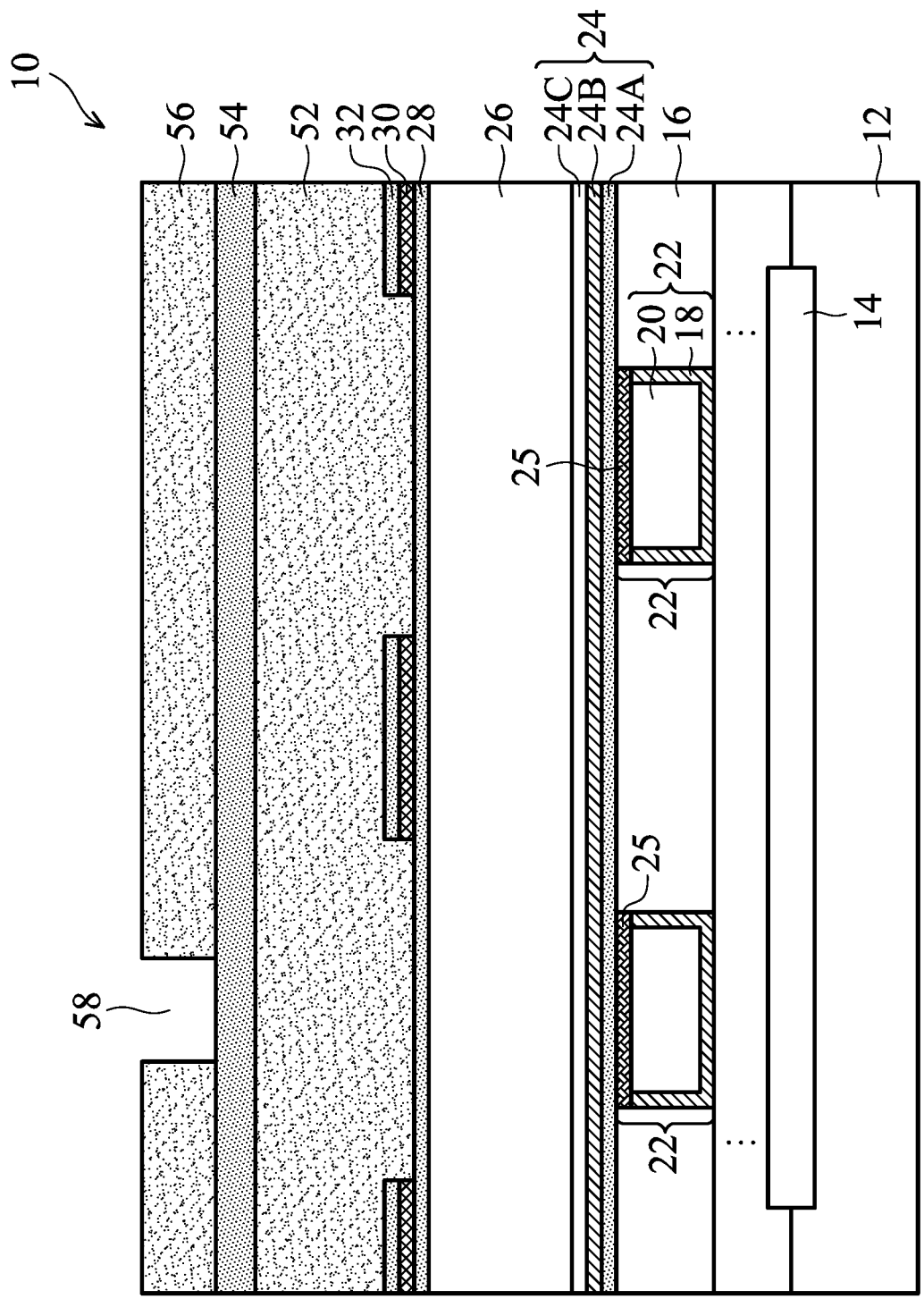
Figure 9:
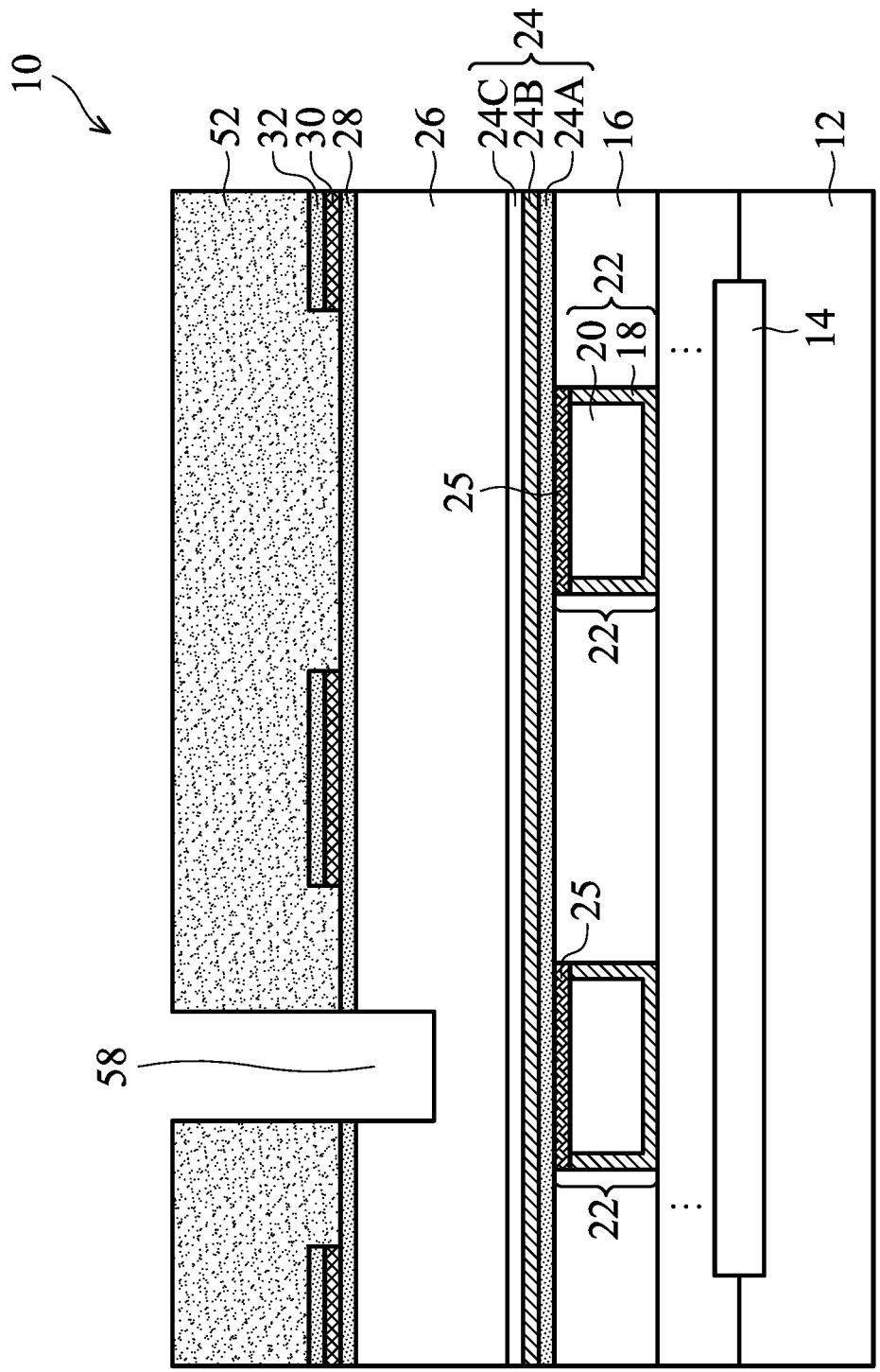
Figure 10:
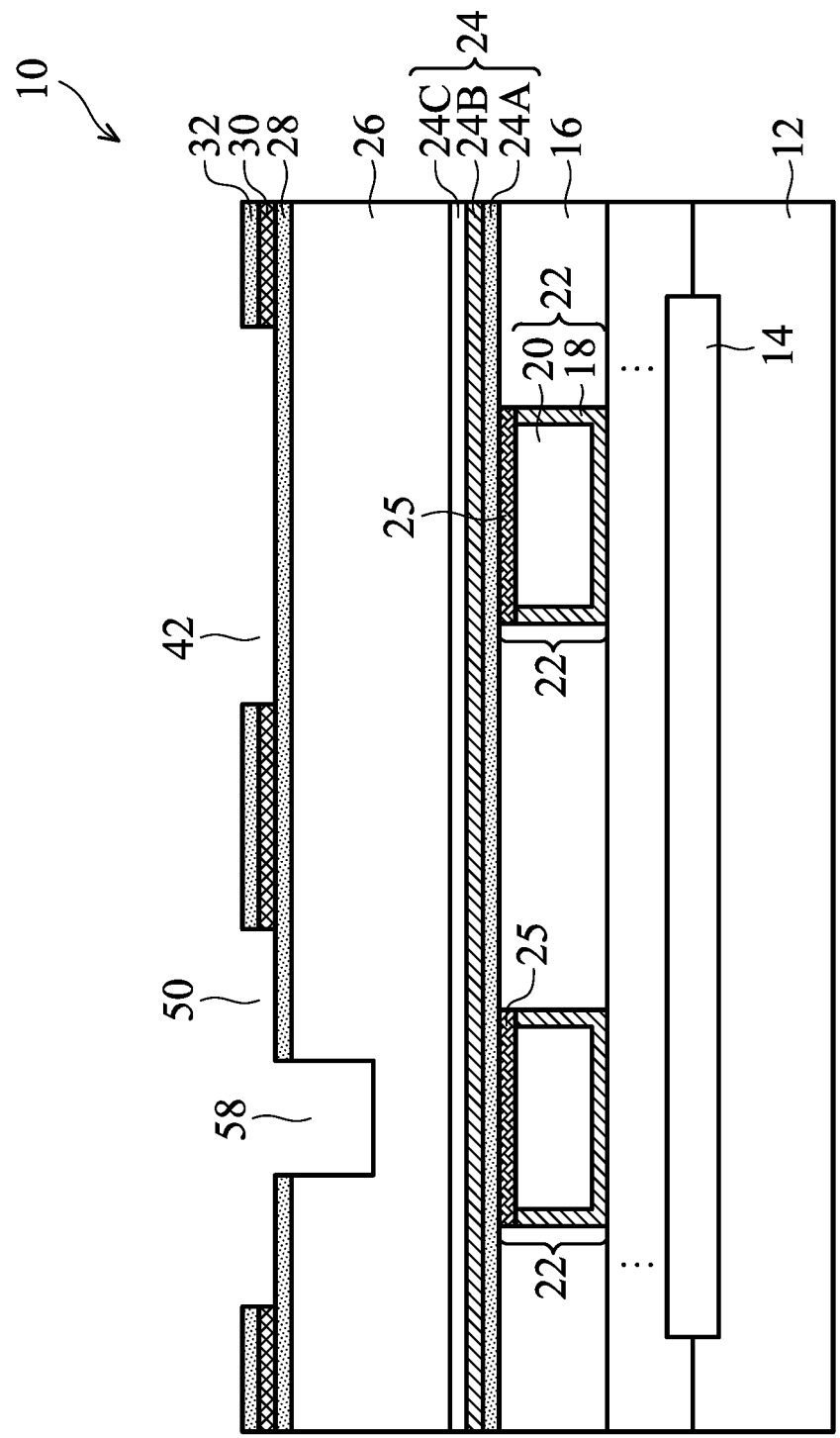

FIGS. 8 through 12 illustrate a 2P2E process for forming via patterns. FIGS. 8 through 10 illustrate the formation of a first via pattern. The respective step is illustrated as step 208 in the process flow shown in FIG. 18. Referring to FIG. 8, a tri-layer including bottom layer 52, middle layer 54, and upper layer 56 is formed. Upper layer 56 is patterned, and includes opening 58, which has the pattern of a subsequently formed via. Next, middle layer 54, bottom layer 52, ARL 28, and dielectric layer 26 are etched, and opening 58 extends into dielectric layer 26. The resulting structure is shown in FIG. 9. The bottom of opening 58 is at an intermediate level (such as at the middle) between a top surface and a bottom surface of layer 26. Upper layer 56 and middle layer 54 (FIG. 8) may be consumed when the formation of opening 58 is finished. The remaining bottom layer 52 is removed, for example, in an ashing process, and the resulting structure is shown in FIG. 10.

Figure 11:
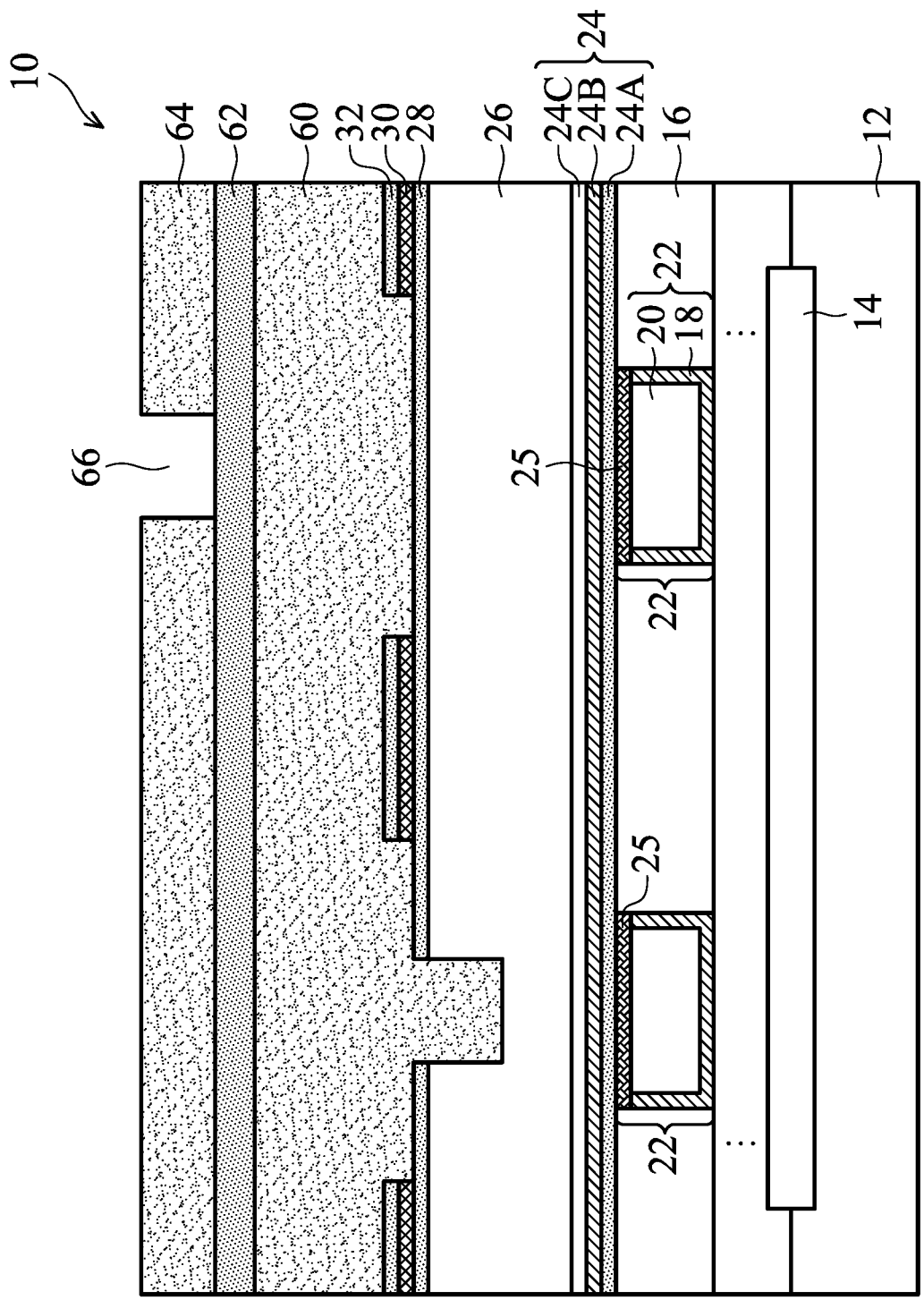
Figure 12:
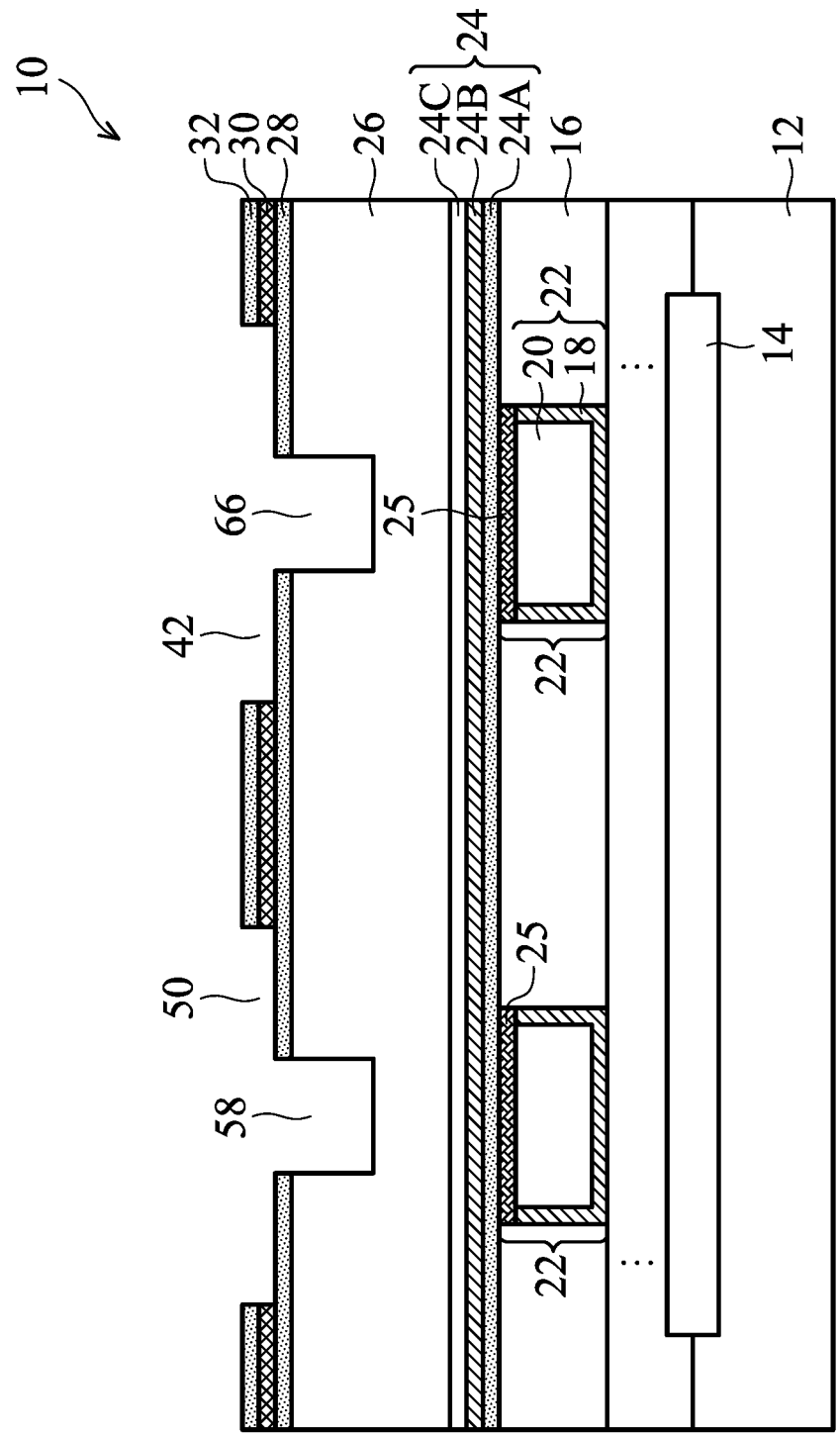

FIGS. 11 and 12 illustrate the formation of a second via pattern. The respective step is illustrated as step 210 in the process flow shown in FIG. 18. Referring to FIG. 11, a tri-layer including bottom layer 60, middle layer 62, and upper layer 64 is formed. Bottom layer 60 extends into opening 58 (FIG. 10) in dielectric layer 26. Upper layer 64 is patterned and includes opening 66, which has the pattern of a subsequently formed via. Next, middle layer 62, bottom layer 60, ARL 28, and dielectric layer 26 are etched, and opening 66 extends into dielectric layer 26. The resulting structure is shown in FIG. 12. The bottom of opening 66 is also at an intermediate level (such as at the middle) between a top surface and a bottom surface of layer 26. The upper layer 64 and middle layer 62 (FIG. 11) may be consumed when the formation of opening 66 is finished. The remaining bottom layer 60 is removed, for example, in an ashing process.

Figure 13:
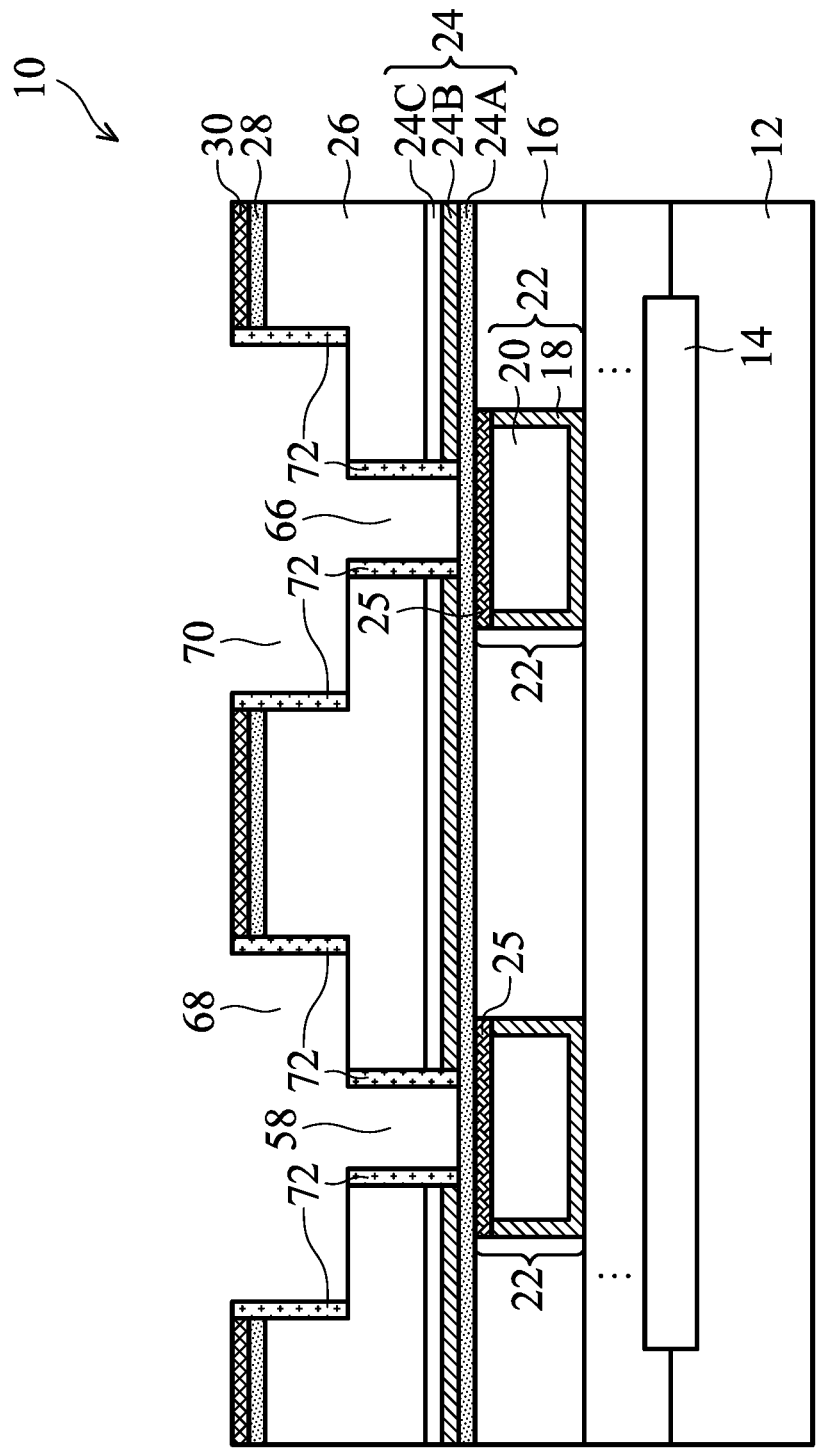

Next, as shown in FIG. 13, an anisotropic etching is performed to etch low-k dielectric layer 26, wherein mask layer 30 is used as the etching mask. Trenches 68 and 70 are thus formed. The etching may be performed using a fluorine-containing gas comprising fluorine and carbon, wherein fluorine is used for etching, with carbon having the effect of protecting the sidewalls of the resulting via openings 58 and 66 and trenches 68 and 70. For example, the process gases for the etching may include $C_4F_8$ and/or $CF_4$. During the anisotropic etching, openings 58 and 66 (FIG. 12) further extend down to the bottom of low-k dielectric layer 26, forming via openings, which are also denoted using reference numerals 58 and 66, respectively. The respective step shown in FIG. 13 is illustrated as step 212 in the process flow shown in FIG. 18. ESL 24 is exposed to via openings 58 and 66. Trenches 68 and 70 have bottoms at an intermediate level between the top surface and the bottom surface of low-k dielectric layer 26.

Etch stop layer 24 is then etched, and hence via openings 58 and 66 extend into etch stop layer 24. In accordance with some embodiments, etch stop layer 24 is etched partially, and a bottom layer such as layer 24A remains not etched-through, while upper layers such as layers 24C and 24B are etched-through. The remaining bottom layer 24A, when not etched-through, may advantageously protects the underlying metal lines 22 from the possible damage caused by the subsequent treatment. In accordance with alternative embodiments, etch stop layer 24 is etched-through, and metal lines 22 are exposed.

FIG. 13 schematically illustrates polymer 72 formed in, particularly on the sidewalls of, trenches 68 and 70 and via openings 58 and 66. Polymer 72 is the by-product of the ashing of photo resist 60 (FIG. 11) and the etching of dielectric layer 26. In accordance with some embodiments, polymer 72 includes elements such as carbon, hydrogen, and/or fluorine, and may also include aluminum and/or copper. Polymer 72 may have the shape of silk, which sticks to the sidewalls of trenches 68 and 70 and via openings 58 and 66. Polymer 72 adversely affects the quality of the subsequent formed metal lines and vias, and will be removed.

Figure 14:
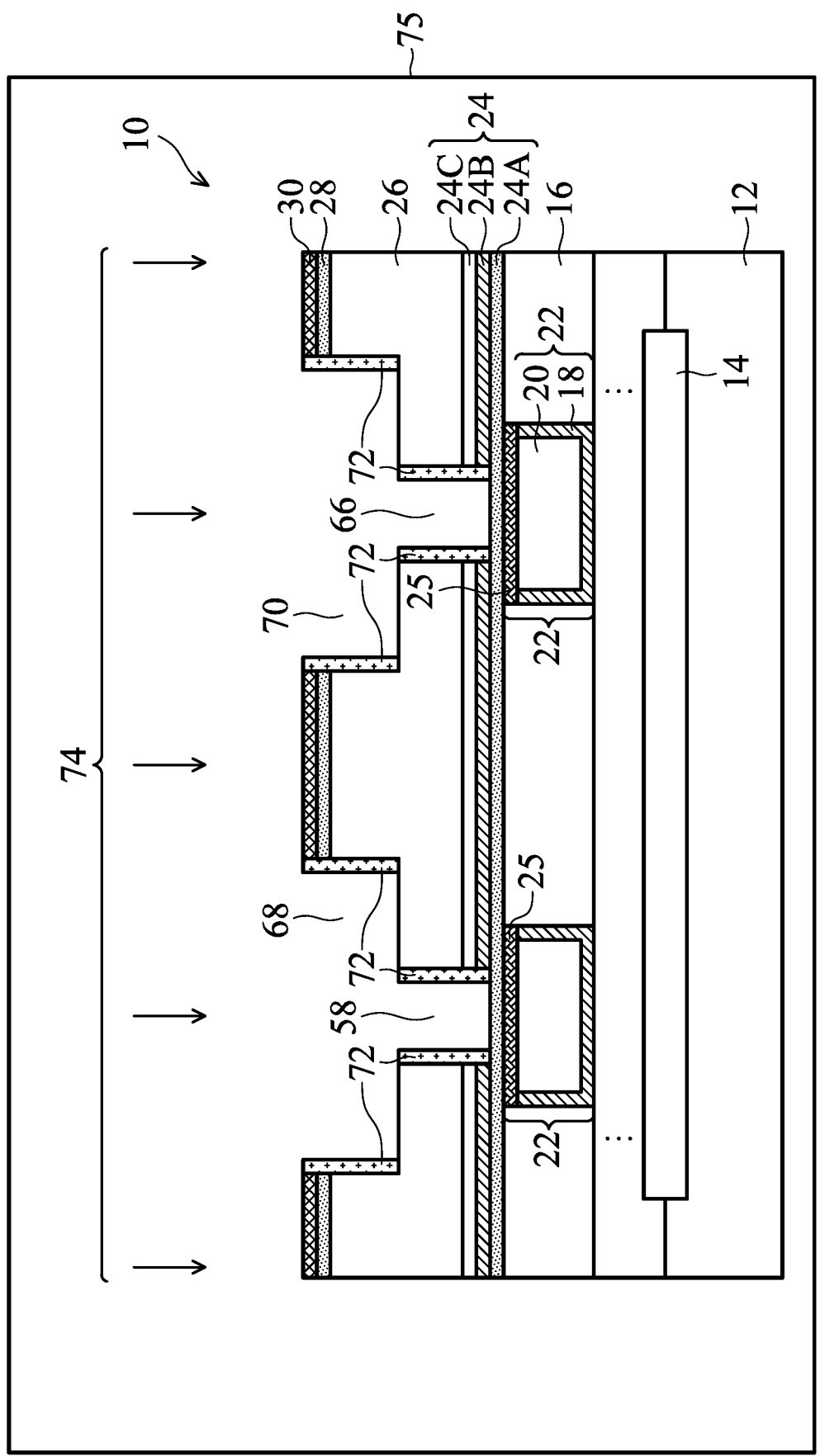

FIG. 14 illustrates an exemplary treatment 74 for removing polymer 72. The respective step is illustrated as step 214 in the process flow shown in FIG. 18. In accordance with some embodiments, the removal of polymer 72 is performed in process chamber 75, which is used for dry etch. Accordingly, process chamber 75 may be a chamber in which vacuum can be generated. The process gas for removing polymer 72 includes nitrogen ($N_2$) and argon, from which the plasma is generated. During the treatment, the pressure of the process gas may be in the range between about 10 mTorr and about 100 mTorr. The temperature of wafer 10 may be in the range between about 20° C. and about 80° C. The flow rate of nitrogen may be in the range between about 10 sccm and about 500 sccm. The flow rate of argon may be in the range between about 10 sccm and about 500 sccm. The source voltage may be in the range between about 200 Watts and about 1,300 Watts. The bias voltage may be in the range between about 10 Watts and about 100 Watts.

Figure 15:
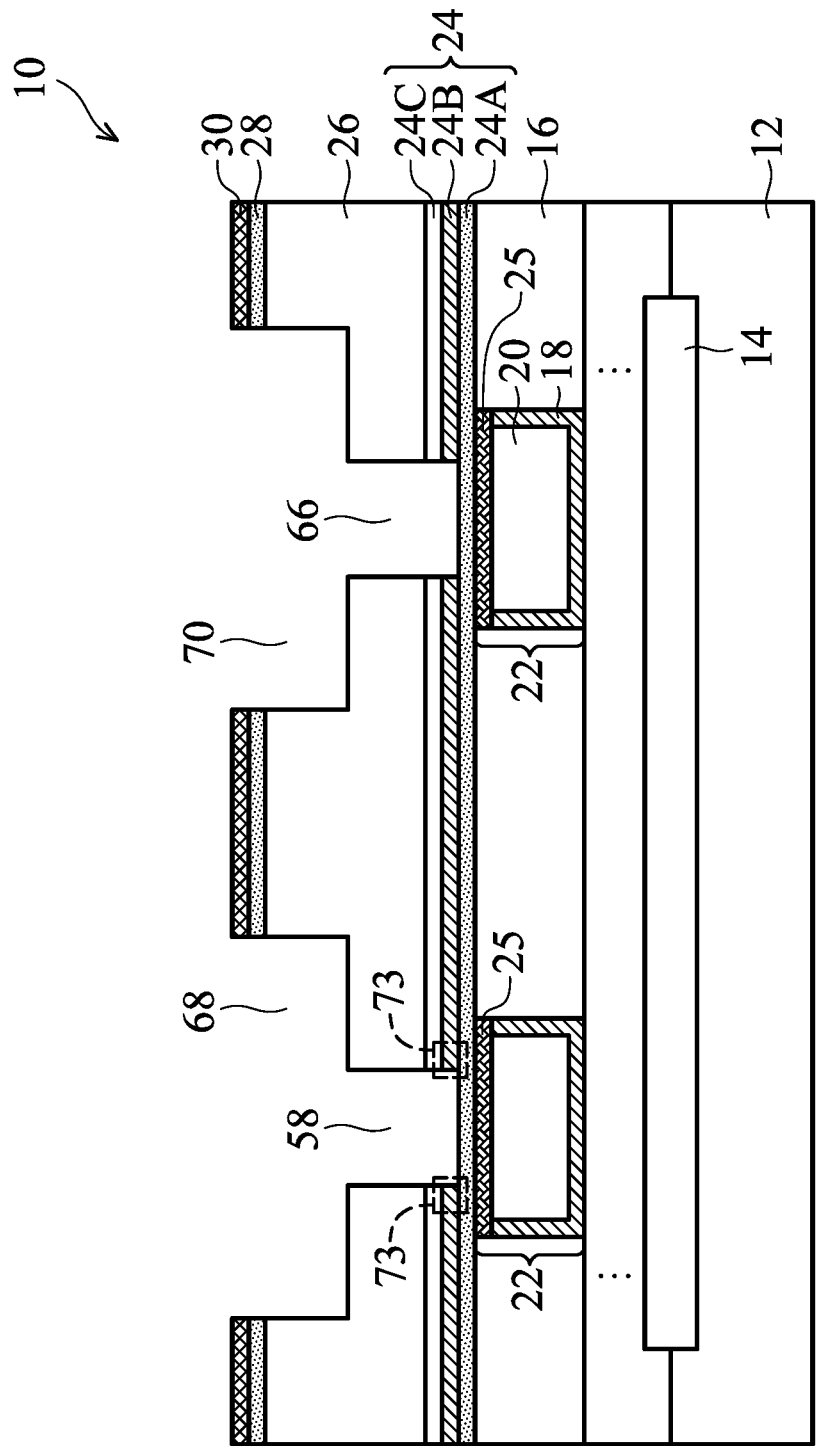
Figure 17:
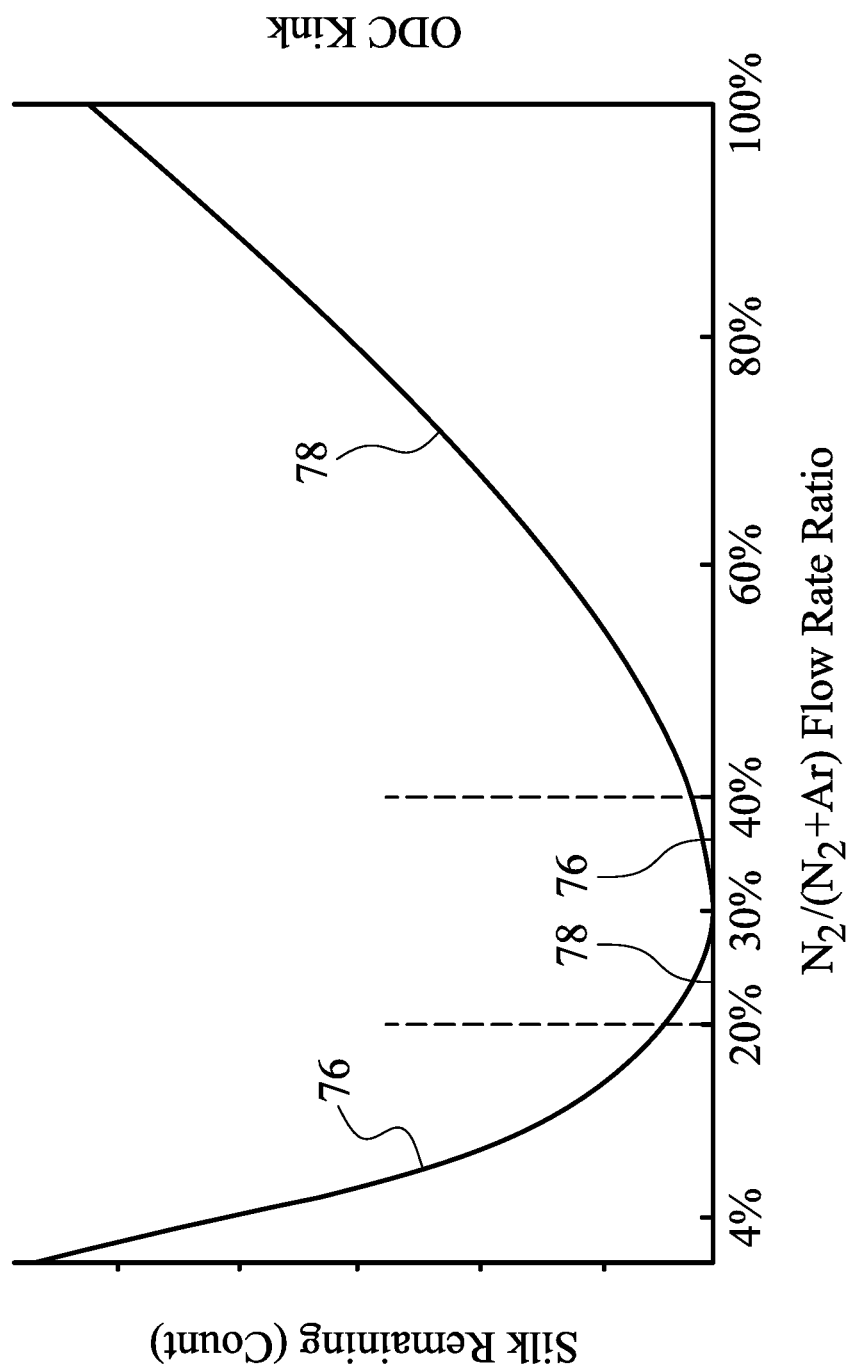
FIG. 17 illustrates the counts of remaining silk-shaped polymer and the scale of kink in via openings as functions of a flow-rate ratio, which is the ratio of a flow rate of nitrogen to a total flow rate of nitrogen and argon.

FIG. 17 illustrates the experimental results obtained by adjusting the flow rates of nitrogen and argon. The X axis represents the nitrogen ratio, which is the ratio of nitrogen flow rate to the total flow rate of nitrogen and argon. The nitrogen ratio may be presented as $FR(N_2)/(FR(N_2)+FR(Ar))$, wherein $FR(N_2)$ is the flow rate of nitrogen, and $FR(Ar)$ is the flow rate of argon. The left Y axis represents the count (number) of the remaining silk-like polymer 72 (FIG. 14). The right Y axis represents the scale of the kink formed in via openings 58 and 66 (FIG. 15). FIG. 15 schematically illustrates where the kinks occur, wherein when portions of layer 24B in regions 73 are etched, undercuts will be formed in regions 73, and are referred to as kinks in layer 24B. Accordingly, the kinks will cause difficulty in the filling of via openings 58 and 66, and are undesirable.

In FIG. 17, line 76 represents the count of the remaining silk-like polymer 72 as a function of the nitrogen ratio, and line 76 corresponds to the left Y axis. The count of the silk-like polymer 72 is measured after the treatments for removing the silk-like polymer in a plurality of sample wafers. The count of the silk-like polymer reduces in response to the increase in the nitrogen ratio. Alternatively stated, silk-like polymer 72 is removed more when the nitrogen ratio is high. When the nitrogen ratio increases to about 20 percent or higher, the count of the silk-like polymer is reduced to a value acceptable to the specification of the production.

Line 78 represents the severity of kinks as a function of the nitrogen ratio, and line 78 corresponds to the right Y axis. Line 78 is also obtained from sample wafers. The right Y axis represents the scale of the kink of dielectric layer 24B, which means the lateral undercut distance in layer 24B. The scale of the kinks reduces in response to the reduction of the nitrogen ratio. When the nitrogen ratio reduces to about 40 percent or lower, the scale of the kinks is reduced to a value acceptable to the specification of the production. Alternatively stated, if the nitrogen ratio is too high, the undercut of layer 24B (FIG. 14) will be too severe.

Combining the facts revealed by lines 76 and 78, it is found that when the nitrogen ratio is in the range between about 20 percent and about 40 percent, the count of the remaining silk-like polymer is low, and the kinks are negligible, both within the specification. Accordingly, in the polymer-removal step as illustrated by FIG. 14, the nitrogen ratio is adjusted to between about 20 percent and about 40 percent.

In accordance with some embodiments of the present disclosure, after the polymer-removal step, which may be performed in a dry etch chamber, a wet etch is performed, which intends for the full removal of polymer 72 (if any is left) as shown in FIG. 14. The respective step is illustrated as step 216 in the process flow shown in FIG. 18. In accordance with some embodiments of the present disclosure, the wet clean is performed using a HF solution. The wafer 10 after the polymer removal is shown in FIG. 15.

Figure 16:
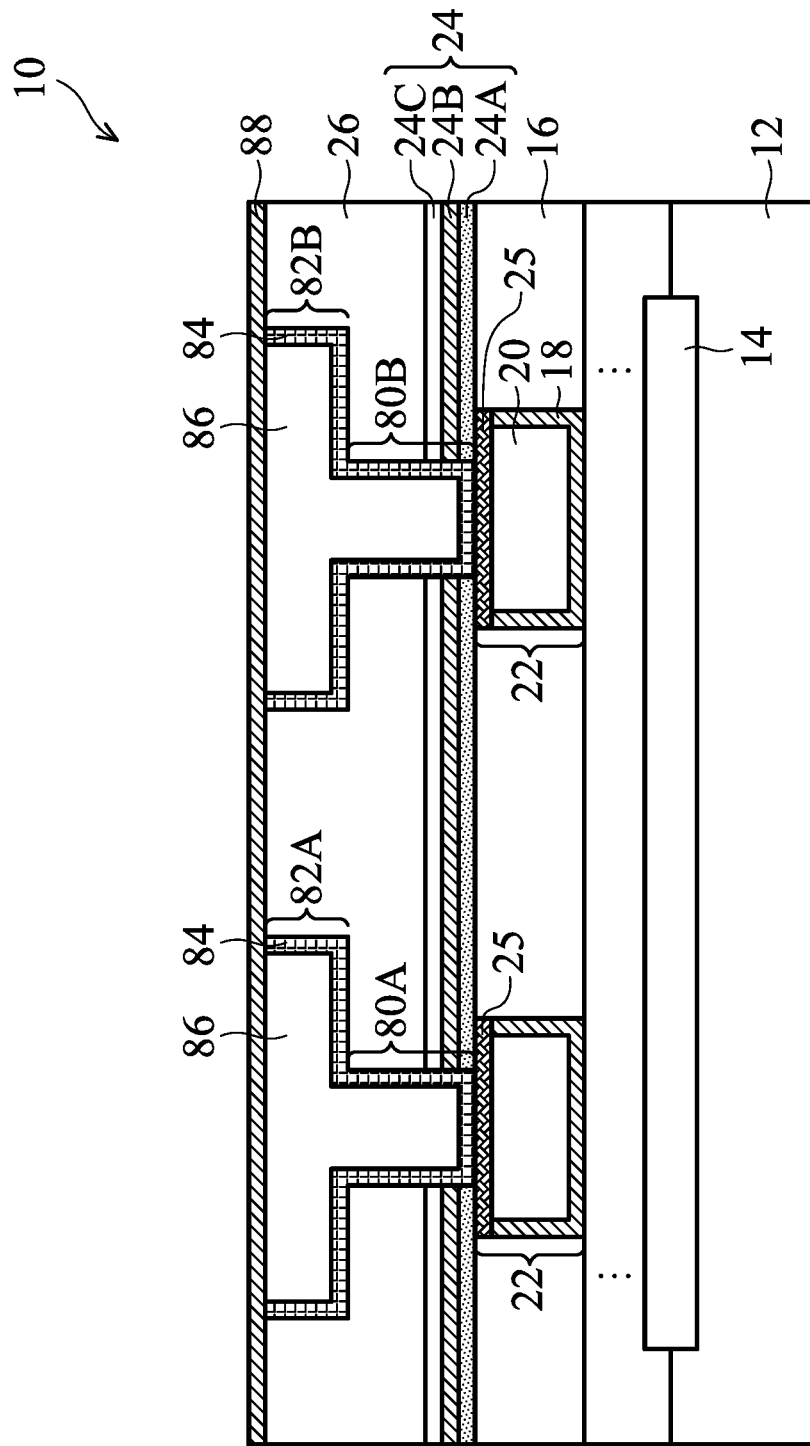

If layer 24A has not been etched-through after the treatment, an additional etching is performed to etch-through layer 24A, exposing the underlying metal lines 22. The respective step is illustrated as step 218 in the process flow shown in FIG. 18. FIG. 16 illustrates the formation of conductive vias 80 (including 80A and 80B) in via openings 58 and 66 (FIG. 15), respectively. Conductive lines 82 (including 82A and 82B) are also formed in trenches 68 and 70 (FIG. 15). The respective step is illustrated as step 220 in the process flow shown in FIG. 18. Vias 80 and conductive lines 82 may include liners 84, such as diffusion barrier layers, adhesion layers, or the like. Liners 84 may be formed of titanium, titanium nitride, tantalum, tantalum nitride, or other alternatives. Vias 80 and conductive lines 82 further include material 86, which is formed of a conductive material such as copper, a copper alloy, silver, gold, tungsten, aluminum, or the like. In accordance with some embodiments, the formation of vias 80 and conductive lines 82 includes performing a blanket deposition to form liner 84, depositing a thin seed layer of copper or copper alloy, and filling the rest of via openings 58 and 66 and trenches 68 and 70 with metal 86, for example, through electro-plating, electro-less plating, deposition, or the like. A planarization such as Chemical Mechanical Planarization (CMP) may be performed to level the surface of conductive lines 82, and to remove excess conductive materials from the top surface of dielectric layer 26. Mask layer 30 and ARL 28 (FIG. 15) are also removed. In subsequent steps, dielectric ESL layer 88 is formed, and more low-k dielectric layers and metal lines and vias (not shown) may be formed over ESL layer 88.

The embodiments of the present disclosure have some advantageous features. By performing a treatment using nitrogen and argon, the polymer generated due to the ashing of photo resist and the etching of dielectric layers may be removed. By adjusting the nitrogen ratio, not only the polymer can be removed more efficiently, but also substantially no kink is generated in the via openings, leading to a better filling of the via openings.

In accordance with some embodiments of the present disclosure, a method includes depositing a mask layer over a dielectric layer, patterning the mask layer to form a trench, applying a patterned photo resist having a portion over the mask layer, and etching the dielectric layer using the patterned photo resist as an etching mask to form a via opening, which is in a top portion of the dielectric layer. The method further includes removing the patterned photo resist, and etching the dielectric layer to form a trench and a via opening underlying and connected to the trench. The dielectric layer is etched using the mask layer as an additional etching mask. A polymer formed in at least one of the trench and the via opening is removed using nitrogen and argon as a process gas. The trench and the via opening are filled to form a metal line and a via, respectively.

In accordance with some embodiments of the present disclosure, a method includes forming an etch stop layer over a metal line, forming a low-k dielectric layer over the etch stop layer, and etching the low-k dielectric layer to form a trench in an upper portion of the low-k dielectric layer, and a via opening in a lower portion of the low-k dielectric layer. A treatment is performed using nitrogen ($N_2$) and argon as a process gas. During the treatment, the nitrogen has a first flow rate, and the argon has a second flow rate, and a ratio of the first flow rate to a sum of the first flow rate and the second flow rate is between about 0.2 and about 0.4. The method further includes etching-through the etch stop layer, and filling the trench and the via opening to form a metal line and a via, respectively.

In accordance with some embodiments of the present disclosure, a method includes performing a first photo lithography process using a first photo resist to form a first trench in a dielectric layer, performing a second photo lithography process using a second photo resist to form a second trench in the dielectric layer, and using the dielectric layer as a first etching mask to etch a hard mask layer and to extend the first trench and the second trench into the hard mask layer. The method further includes performing a third photo lithography process using a third photo resist to form a first via opening in an upper portion of a low-k dielectric layer underlying the hard mask layer, performing a fourth photo lithography process using a fourth photo resist to form a second via opening in the upper portion of the low-k dielectric layer, and etching the low-k dielectric layer using the hard mask layer as a second etching mask to extend the first trench and the second trench into the low-k dielectric layer. The first via opening and the second via opening extend into a bottom portion of the low-k dielectric layer. The method further includes performing a treatment using nitrogen ($N_2$) and argon as a process gas to remove a polymer in the first trench, the second trench, the first via opening and the second via opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming an etch stop layer over a metal line, wherein the forming the etch stop layer comprises depositing a first layer and depositing a second layer over the first layer, wherein the first layer and the second layer are formed of different materials;
forming a dielectric layer over the etch stop layer;
depositing a mask layer over the dielectric layer;
patterning the mask layer to form a first trench;
applying a patterned photo resist comprising a portion over the mask layer;
etching the dielectric layer to form a second trench and a via opening, wherein the via opening is underlying and connected to the second trench, and wherein the dielectric layer is etched using the mask layer as an additional etching mask;
after the dielectric layer is etched, etching-through the second layer of the etch stop layer;
after the second layer of the etch stop layer is etched-through, removing a polymer formed in at least one of the second trench and the via opening using a process gas including nitrogen and argon, wherein the polymer comprises by-products generated by the etching the dielectric layer;
after the polymer is removed, etching-through the first layer of the etch stop layer; and
filling the second trench and the via opening to form an additional metal line and a via, respectively.

2. The method of claim 1, wherein during the removing the polymer, a nitrogen ratio of a flow rate of nitrogen to a total flow rate of nitrogen and argon is between about 20 percent and about 40 percent.

3. The method of claim 1, wherein the forming the etch stop layer further comprises depositing a third layer between the first layer and the second layer, wherein the third layer is etched-through before the polymer is removed.

4. The method of claim 1, wherein the first layer of the etch stop layer comprises aluminum nitride, and the second layer of the etch stop layer comprises aluminum oxide.

5. The method of claim 1 further comprising, after the removing the polymer using nitrogen and argon, performing a wet etch to further remove the polymer.

6. The method of claim 1 further comprising forming an additional via opening, wherein the via opening and the additional via opening are formed in a double-patterning process.

7. The method of claim 6, wherein the patterned photo resist further comprises an additional portion filling the additional via opening when the dielectric layer is etched to form the via opening.

8. The method of claim 1 further comprising forming an additional trench in the mask layer, wherein the first trench and the additional trench are formed in an additional double-patterning process, and the patterned photo resist comprises portions in the first trench and the additional trench when the dielectric layer is etched to form the via opening.

9. A method comprising:
forming an etch stop layer over a metal line, wherein the forming the etch stop layer comprises depositing a first layer and depositing a second layer over the first layer, wherein the first layer and the second layer are formed of different materials;
forming a low-k dielectric layer over the etch stop layer;
etching the low-k dielectric layer to form a trench in an upper portion of the low-k dielectric layer, and a via opening in a lower portion of the low-k dielectric layer;
etching-through the second layer of the etch stop layer;
after the second layer of the etch stop layer is etched-through, performing a treatment using a process gas including nitrogen ($N_2$) and argon;
after the treatment, etching-through the first layer of the etch stop layer; and
filling the trench and the via opening to form an additional metal line and a via, respectively.

10. The method of claim 9, wherein the depositing the first layer comprises depositing an aluminum nitride layer, and the depositing the second layer comprises depositing an Oxygen-doped Silicon carbide (ODC) layer.

11. The method of claim 10, wherein the forming the etch stop layer further comprises depositing an aluminum oxide layer over the ODC layer.

12. The method of claim 9, wherein when the treatment is performed, the metal line is separated from the process gas by the first layer of the etch stop layer.

13. The method of claim 9, wherein the treatment is performed in a chamber configured for vacuuming.

14. The method of claim 9, wherein the trench is formed using a hard mask layer as an etching mask, and the treatment is further performed on the hard mask layer.

15. The method of claim 1, wherein the forming the etch stop layer further comprises depositing a third layer between the first layer and the second layer, wherein the third layer is etched-through before the polymer is removed.

16. The method of claim 1, wherein the removing the polymer is performed at a temperature in a range between about 20° C. and about 80° C.

17. A method comprising:
forming an etch stop layer over a metal line, wherein the forming the etch stop layer comprises depositing a first layer and depositing a second layer over the first layer, wherein the depositing the first layer comprises depositing an aluminum nitride layer, and the depositing the second layer comprises depositing an Oxygen-doped Silicon carbide (ODC) layer;
forming a low-k dielectric layer over the etch stop layer;
etching the low-k dielectric layer to form a trench in an upper portion of the low-k dielectric layer, and a via opening in a lower portion of the low-k dielectric layer;
etching-through the second layer of the etch stop layer;
after the second layer of the etch stop layer is etched-through, performing a treatment using a process gas including nitrogen ($N_2$) and argon, wherein when the treatment is performed, the metal line is separated from the process gas by the first layer of the etch stop layer;
after the treatment, etching-through the first layer of the etch stop layer; and
filling the trench and the via opening to form an additional metal line and a via, respectively.

18. The method of claim 17, wherein the forming the etch stop layer further comprises depositing an aluminum oxide layer over the ODC layer.

19. The method of claim 17, wherein the treatment is performed in a chamber configured for vacuuming.

20. The method of claim 17 wherein the trench is formed using a hard mask layer as an etching mask, and the treatment is further performed on the hard mask layer.

* * * * *